United States Patent [19]

Kubik

[11] 4,061,410

[45] Dec. 6, 1977

[54] CIRCUIT BOARD TERMINAL IDENTIFICATION DEVICE

[75] Inventor: Peter Steve Kubik, South Plainfield, N.J.

[73] Assignee: Bell Telephone Laboratories, Incorporated, Murray Hill, N.J.

[21] Appl. No.: 779,160

[22] Filed: Mar. 18, 1977

[51] Int. Cl.² .............................................. H01R 3/00
[52] U.S. Cl. .............................. 339/113 B; 339/18 B; 339/150 T
[58] Field of Search ............. 339/113 B, 113 R, 18 B, 339/150 T, 221 M, 276 A

[56] References Cited

U.S. PATENT DOCUMENTS 3,778,751  12/1973  Walsh .............................. 339/113 B Primary Examiner—Roy Lake
Assistant Examiner—DeWalden W. Jones
Attorney, Agent, or Firm—John W. Fisher

[57] ABSTRACT

An identification device for a printed circuit board, having a plurality of wirewrap terminals, includes a base portion and a plurality of flexibly mounted, raised identification projections. The base portion has provision therein for securing the device to spaced-apart rows of generally parallel terminals. When the device is in place, the flexible mounting arrangement for the identification projections permits ready access by a wirewrap tool.

7 Claims, 4 Drawing Figures

CIRCUIT BOARD TERMINAL IDENTIFICATION DEVICE

BACKGROUND OF THE INVENTION

1. Field of the Invention

This invention relates to insulator apparatus and, in particular, to an insulative device with identifier means.

2. Description of the Prior Art

In many laboratory applications, the initial fabrication of a circuit design utilizing dual in-line circuit packages is effected with a printed circuit board having a plurality of wirewrap terminals emanating from one side. Almost all cross-connections between the various packages are completed with individual leads wire-wrapped to the terminals. Frequently, these connections are identified on a wiring list which sets out the row and terminal numbers for the terminals to be cross-connected. As the density of the cross-connect wiring increases, it becomes extremely difficult to rapidly identify the proper terminals. To date it appears that this problem remains without solution.

Accordingly, it is one object of the present invention to decrease the amount of time required to effect circuit cross-connections called for on a circuit wiring list.

Another object is to improve the degree of accuracy in completed circuit cross-connections.

A further object of the present invention is to clearly identify the row and terminal number of each terminal on the printed circuit board even when the cross-connection wiring becomes relatively dense.

Yet another object is to facilitate terminal identification by having terminal identification markings juxtaposed exposed terminal tips.

Still a further object of the present invention is to provide an identification device which when installed still permits ready access by a wirewrap tool.

An even further object is to include provision in the identification device for securing it to rows of parallel wirewrap terminals.

SUMMARY OF THE INVENTION

The foregoing and other objects of the invention are realized in an illustrative embodiment of apparatus for facilitating identification of parallel rows of interconnection terminals on a printed circuit board. This apparatus includes a base portion which has integral therewith provision for securing the device to parallel rows of pins. Spaced apart from the base portion are a plurality of flexibly mounted wedge-shaped tips which carry one or more identification markings thereon.

Accordingly, it is one feature of the present invention that terminal identification markings are presented to a craftsperson at a point adjacent to the tips of individual wirewrap terminals.

Another feature is that the identification device has provision therein for securing it to parallel rows of wirewrap terminals.

Yet another feature of the present invention is that the wedge-shaped tips carrying the terminal identification markings are flexibly mounted to the base to permit ready access to an individual terminal by a wire-wrap tool.

A further feature is that the flexibly mounted wedge-shaped tips are spaced apart from one another such that individual cross-connection leads can be advantageously routed on the circuit board without coming into contact with a terminal except at the desired end points.

BRIEF DESCRIPTION OF THE DRAWINGS

The aforementioned objects and features of the invention, as well as other objects and features, will be better understood upon a consideration of the following detailed description and the appended claims taken in conjunction with the attached drawings of an illustrative embodiment in which:

DETAILED DESCRIPTION

Figure 1:
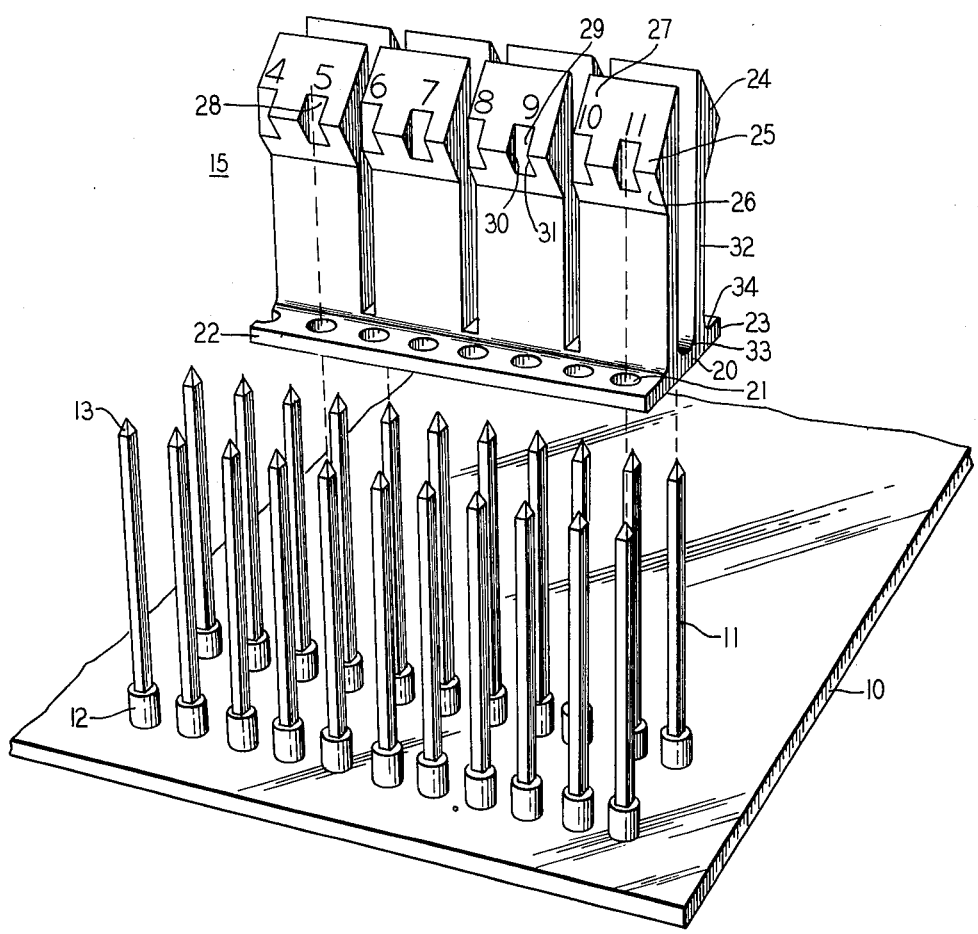
FIG. 1 is a perspective view of a printed circuit board having a plurality of wirewrap terminals on one side with the terminal identification device about to be brought into engagement with the circuit board.

Illustrated in FIG. 1 is a circuit board 10 having a plurality of interconnection pins 11 secured thereto. Each of pins 11 has a base 12 the diameter of which is slightly larger than the peripheral dimensions of the pin itself.

Identification device 15 fits over a pair of parallel rows of pins 11 to facilitate their identification when the interconnection wiring on board 10 becomes somewhat dense. Identification device 15 includes a base portion 20 having a plurality of spaced-apart, generally circular apertures 21 distributed along edge regions 22 and 23. Each of the apertures 21 has a diameter slightly smaller than a diameter of base 12. The spacing between the parallel rows of apertures 21 are such that when the device 15 is brought down over pins 11 all of the pins within a given area engage corresponding apertures 21 in base portion 20. Device 15 is secured to the parallel rows of interconnection pins 11 in circuit board 10 by the frictional engagement or interference fit of apertures 21 with pin bases 12. This engagement is most clearly illustrated in FIG. 2.

Spaced apart from base portion 20 are a number of triangular-shaped projections 24. These projections are flexibly fastened to base portion 20 by elongated member 32 which is integral with and extends generally perpendicularly away from base portion 20. Each of projections 24 has faces 25 and 26 which intersect at a point spaced apart from elongated member 32 such that face 25 is juxtaposed a tip 13 of pin 11. On face 25 one or more identification markings 27 are either stamped, molded, printed, or the like.

Figure 2:
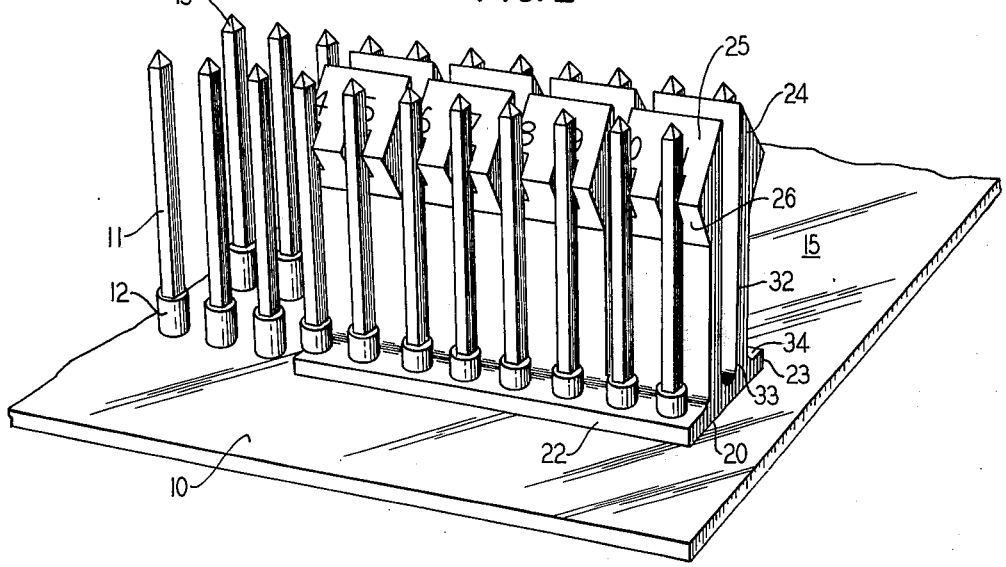
FIG. 2 is a perspective view of the terminal identification device in place on the printed circuit board.

Projections 24 further include one or more generally U-shaped channels 28 which intersect faces 25 and 26. Channels 28, as shown in FIG. 2, loosely engage an adjacent interconnection pin 11 once device 15 is in place on board 10. Each of channels 28 has a rear face 29 and first and second side faces 30 and 31. Rear face 29 lies in a plane generally parallel with a plane containing elongated member 32. Side faces 30 and 31 are spaced apart from one another by a width dimension slightly larger than a width dimension of one of the interconnection pins 11. This spacing arrangement advantageously enables identification marking 27 to be positioned adjacent a pin tip 13 during normal engagement of device 15 with pins 11.

Figure 3:
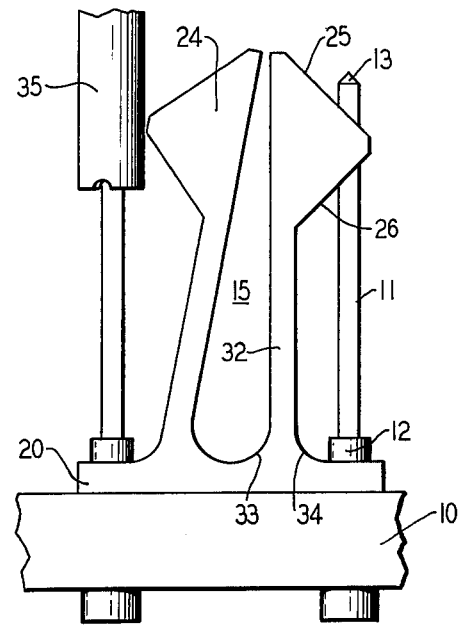
FIG. 3 is a side view of the device installed on the printed circuit board with one of the identification tips shifted out of position by a wirewrap tool.
Figure 4:
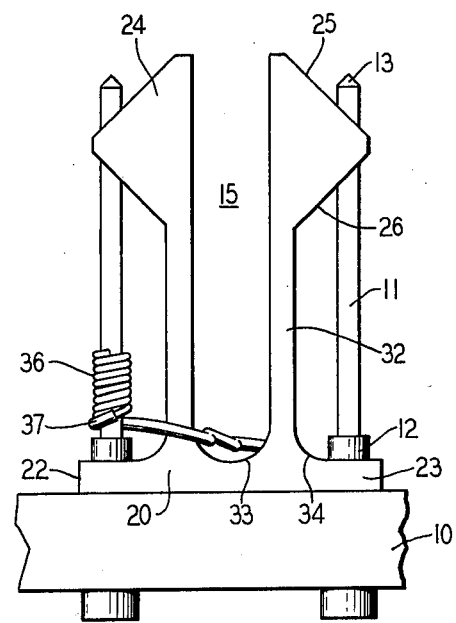
FIG. 4 is a side view similar to FIG. 3 illustrating a completed connection with the identification tip restored to its normal position.

As shown in FIG. 3, elongated members 32 have a pair of arcuate surfaces 33 and 34 at the point of connection with base portion 20. Surfaces 33 and 34 produce a thickening in elongated member 32 in a region juxtaposed base portion 20. This thickening enables repeated elastic flexures of triangular projection 24 outwardly and away from interconnection pin 11 when a wiring tool 35 (partially shown) is brought into engagement with pin 11. After a wirewrap connection 36 of lead 37 is effected, as shown in FIG. 4, withdrawal of wirewrap tool 35 permits projection 24 to return to a normal state, that is, a position wherein U-shaped channels 28 loosely engage interconnection pins 11.

In all cases, it is to be understood that the above-described embodiment is illustrative of but a small number of many possible specific embodiments which can represent applications of the principles of the invention. Thus, numerous and various other embodiments can readily be devised in accordance with these principles by those skilled in the art without departing from the spirit and scope of the invention.

What is claimed is:

1. Apparatus for facilitating identification of parallel rows of interconnection pins on a circuit board including
   a base portion,
   means, integral with said base portion, for securing said apparatus to said parallel rows of interconnection pins,
   identifier means, and
   means for flexibly mounting said identifier means to said base portion.

2. The apparatus in accordance with claim 1 wherein said securing means includes
   a pair of parallel edge regions integral with said base portion, said edge regions having a plurality of spaced-apart generally circular apertures distributed therein, each of said apertures having a diameter slightly smaller than a base diameter of each of said interconnection pins so that said apparatus is held to said pins by an interference fit.

3. The apparatus in accordance with claim 1 wherein said identifier means includes
   first and second generally parallel rows of generally triangular-shaped projections, each of said projections having first and second faces which intersect at a point spaced apart from said mounting means, each of said first faces having at least one identification marking thereon.

4. The apparatus in accordance with claim 3 further including
   at least one generally U-shaped channel intersecting said first and second faces of each of said triangular-shaped projections, said channel having a rear face lying in a plane which is generally parallel with a plane containing said mounting means and first and second side faces spaced apart from one another by a width dimension slightly larger than a width dimension of one of said interconnection pins, said channel loosely engaging one of said interconnection pins so that an end of the pin is juxtaposed said identification marking.

5. The apparatus in accordance with claim 1 wherein said mounting means includes
   a plurality of spaced-apart, generally rectangular-shaped, elongated members, each of said members having integral therewith at one end said identifier means and further being integral with and generally perpendicularly extending from said base portion, each of said members having first and second generally oppositely directed arcuate surfaces producing a thickening in said member in a region juxtaposed said base portion, said thickening enabling repeated elastic flexures of said identifier means as a wiring tool engages one of said interconnection pins.

6. Apparatus for facilitating identification of parallel rows of interconnection pins on a circuit board including
   a base portion having a plurality of spaced-apart, generally circular apertures distributed along parallel edge regions thereof, each of said apertures having a diameter slightly smaller than a base diameter of each of said interconnection pins for frictionally securing said apparatus to said interconnection pins, and
   a plurality of spaced-apart, generally rectangular-shaped elongated members integral with and extending generally perpendicularly away from said base portion, each of said members having integral therewith at one end a generally triangular-shaped projection, said projection having first and second faces which intersect at a point spaced apart from one of said elongated members, said first face having at least one identification marking thereon, each of said elongated members intersecting said base portion at an opposite end and having first and second generally oppositely directed arcuate surfaces producing a thickening in said members in a region juxtaposed said base portion, said thickening enabling repeated elastic flexures of said triangular-shaped projection as a wiring tool engages one of said interconnection pins.

7. The apparatus in accordance with claim 6 further including
   at least one U-shaped channel intersecting said first and second faces on said triangular-shaped projection, said channel having a rear face lying in a plane which is generally parallel with a plane containing said elongated members and first and second side faces spaced apart from one another by a width dimension slightly larger than a width dimension of one of said interconnection pins, said channel loosely engaging one of said interconnection pins so that an end of the pin is juxtaposed said identification marking.

* * * * *